United States Patent
Koh et al.

(10) Patent No.: US 11,393,760 B2
(45) Date of Patent: *Jul. 19, 2022

(54) FLOATING-BRIDGE INTERCONNECTS AND METHODS OF ASSEMBLING SAME

(71) Applicant: Intel Corporation, Santa Clara, CA (US)

(72) Inventors: Boon Ping Koh, Seberang Jaya (MY); Eng Huat Goh, Penang (MY); Jiun Hann Sir, Gelugor (MY); Khang Choong Yong, Puchong (MY); Min Suet Lim, Simpang Ampat (MY); Wil Choon Song, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/021,599

(22) Filed: Sep. 15, 2020

(65) Prior Publication Data
US 2020/0411438 A1    Dec. 31, 2020

Related U.S. Application Data

(63) Continuation of application No. 16/284,218, filed on Feb. 25, 2019, now Pat. No. 10,796,999.

(30) Foreign Application Priority Data

Mar. 30, 2018    (MY) .......................... PI 2018701321

(51) Int. Cl.
| | |
|---|---|
| *H01L 23/538* | (2006.01) |
| *H01L 25/065* | (2006.01) |
| *H01L 25/00* | (2006.01) |
| *H01L 23/31* | (2006.01) |
| *H01L 23/498* | (2006.01) |
| *H01L 23/00* | (2006.01) |

(52) U.S. Cl.
CPC ...... *H01L 23/5381* (2013.01); *H01L 23/3135* (2013.01); *H01L 23/49822* (2013.01);
(Continued)

(58) Field of Classification Search
CPC ......... H01L 23/49816; H01L 23/49822; H01L 23/5384; H01L 23/5386; H01L 23/5389;
(Continued)

(56) References Cited

U.S. PATENT DOCUMENTS

| | | |
|---|---|---|
| 8,064,224 B2 | 11/2011 | Mahajan et al. |
| 8,102,663 B2 | 1/2012 | Cunningham et al. |
| (Continued) | | |

OTHER PUBLICATIONS

U.S. Appl. No. 16/284,218, filed Feb. 25, 2019, Floating-Bridge Interconnects and Methods of Assembling Same.
(Continued)

*Primary Examiner* — Dao H Nguyen
(74) *Attorney, Agent, or Firm* — Schwegman Lundberg & Woessner, P.A.

(57) ABSTRACT

A semiconductor apparatus includes a floating-bridge interconnect that couples two semiconductive devices that are arranged across a middle semiconductive device. The floating-bridge interconnect can be semiconductive material such as a silicon bridge, or it can be an organic bridge. Computing functions required in one of the two semiconductive devices can be off-loaded to any of the floating-bridge interconnect or the other of the two semiconductive devices.

19 Claims, 11 Drawing Sheets

(52) U.S. Cl.
CPC ...... *H01L 23/5384* (2013.01); *H01L 23/5386* (2013.01); *H01L 23/5389* (2013.01); *H01L 25/0655* (2013.01); *H01L 25/50* (2013.01); *H01L 23/49816* (2013.01); *H01L 24/13* (2013.01); *H01L 24/16* (2013.01); *H01L 2224/13147* (2013.01); *H01L 2224/16235* (2013.01)

(58) Field of Classification Search
CPC . H01L 23/3135; H01L 23/5381; H01L 24/13; H01L 24/16; H01L 25/0655; H01L 25/50; H01L 2224/13147; H01L 2224/16235
USPC ........................................................ 257/668
See application file for complete search history.

(56) References Cited

U.S. PATENT DOCUMENTS

| | | | |
|---|---|---|---|
| 8,519,543 B1* | 8/2013 | Song | H01L 23/147 257/774 |
| 9,806,014 B2* | 10/2017 | Alfano | H01L 24/81 |
| 10,504,847 B2* | 12/2019 | Chang | H01L 24/24 |
| 10,580,738 B2* | 3/2020 | Sikka | H01L 24/14 |
| 10,796,999 B2* | 10/2020 | Koh | H01L 24/20 |
| 2006/0226527 A1 | 10/2006 | Hatano et al. | |
| 2010/0327424 A1 | 12/2010 | Braunisch et al. | |
| 2014/0185264 A1* | 7/2014 | Chen | H01L 25/0652 361/814 |
| 2015/0171015 A1* | 6/2015 | Mahajan | H01L 21/568 257/712 |
| 2016/0141234 A1* | 5/2016 | We | H01L 23/5385 361/767 |
| 2019/0304914 A1 | 10/2019 | Koh et al. | |

OTHER PUBLICATIONS

"U.S. Appl. No. 16/284,218, Non Final Office Action dated Jan. 24, 2020", 16 pgs.
"U.S. Appl. No. 16/284,218, Response filed Apr. 2, 2020 to Non Final Office Action dated Jan. 24, 2020", 18 pgs.
"U.S. Appl. No. 16/284,218, Notice of Allowance dated Jun. 1, 2020", 5 pgs.

* cited by examiner

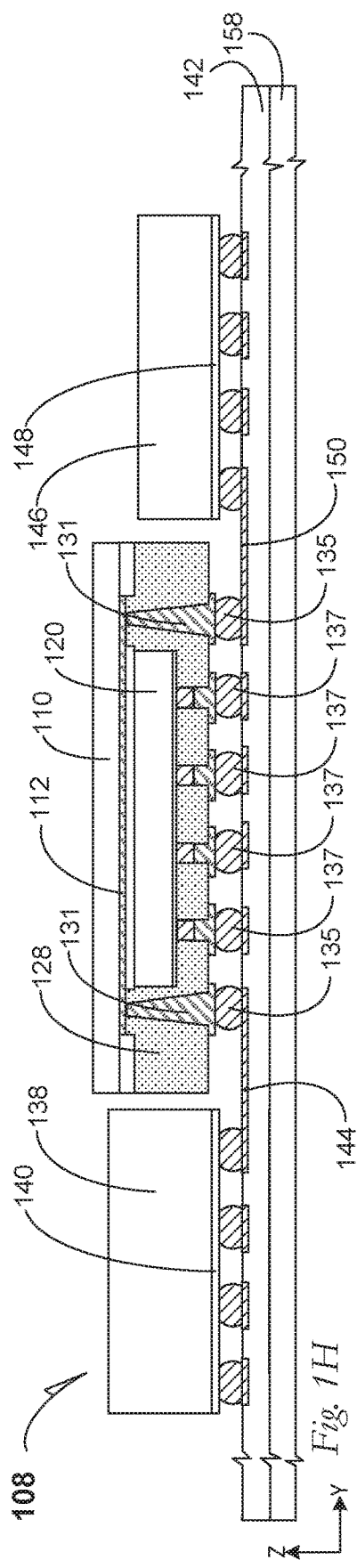
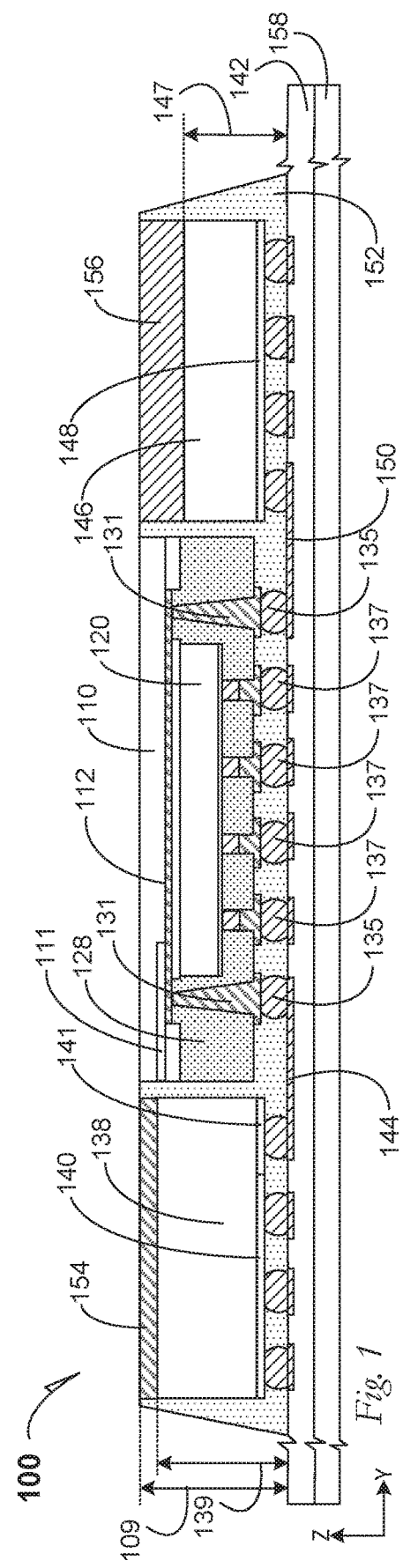

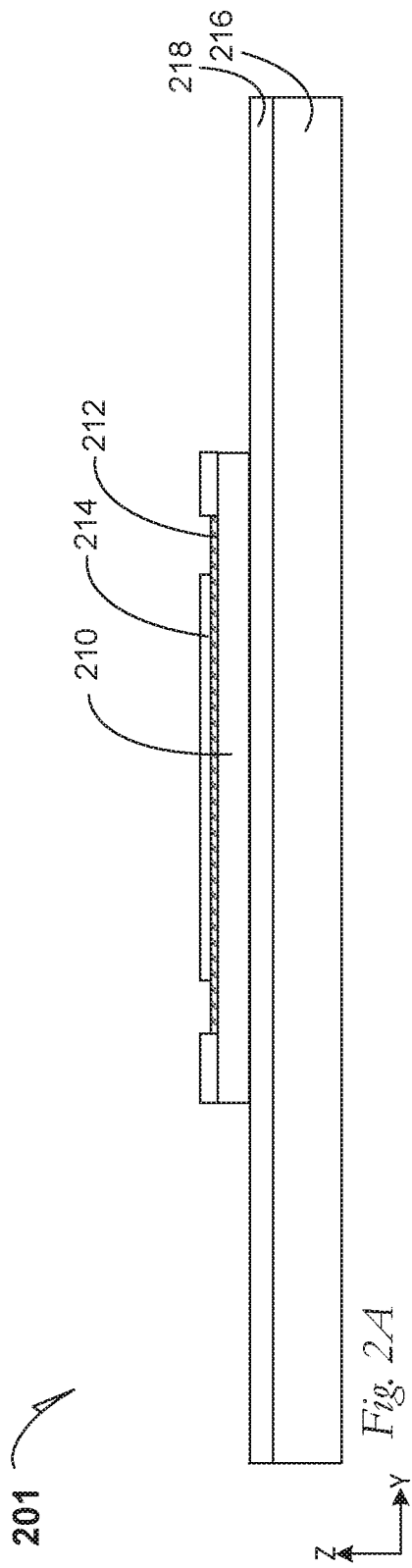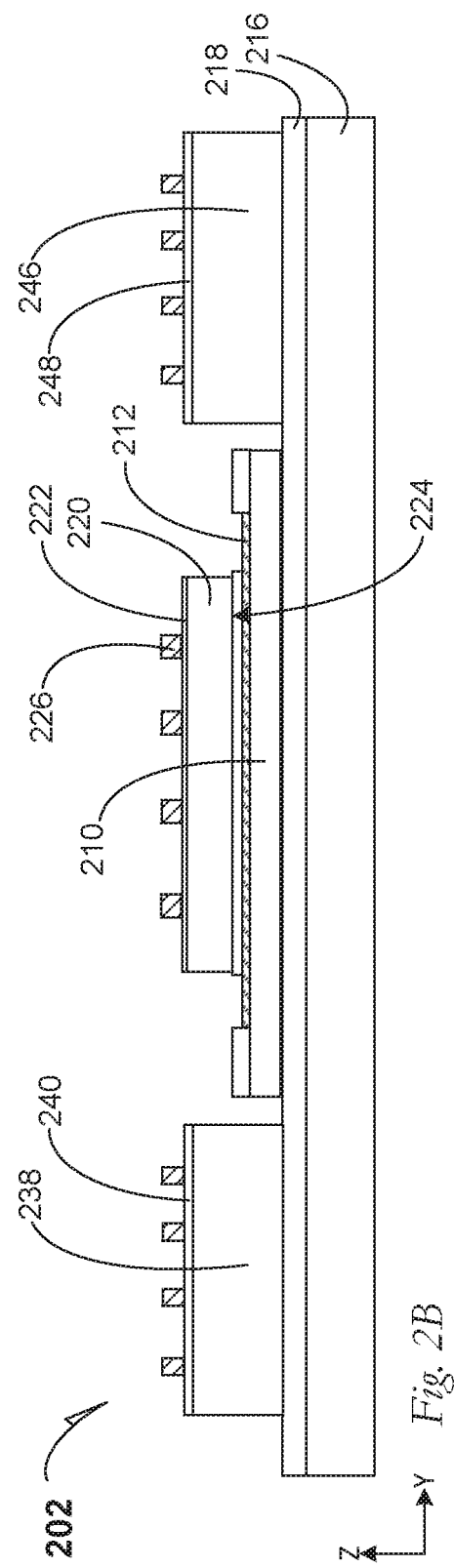

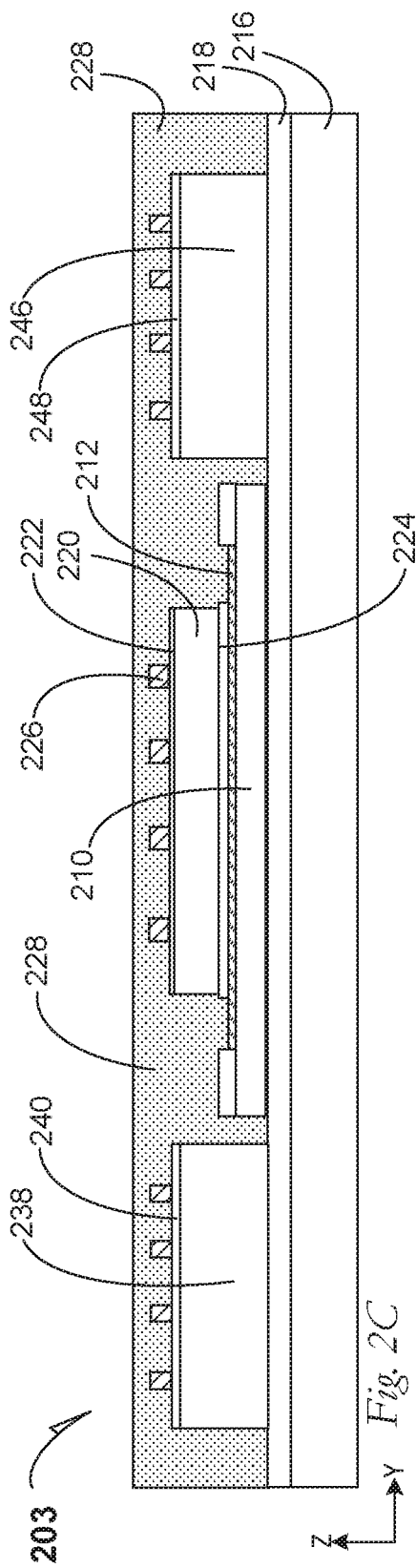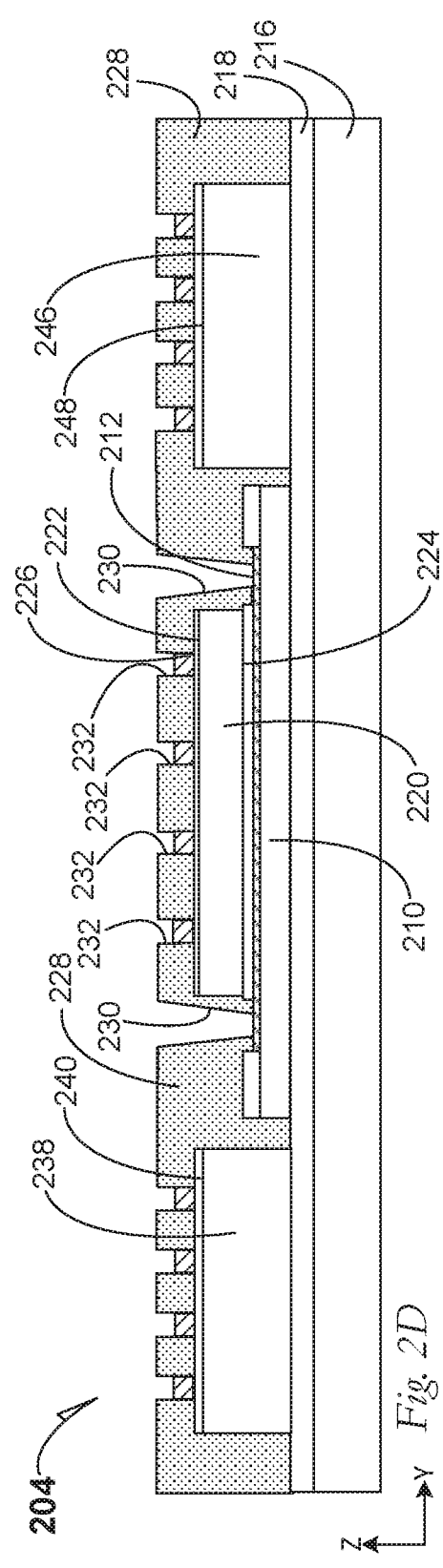

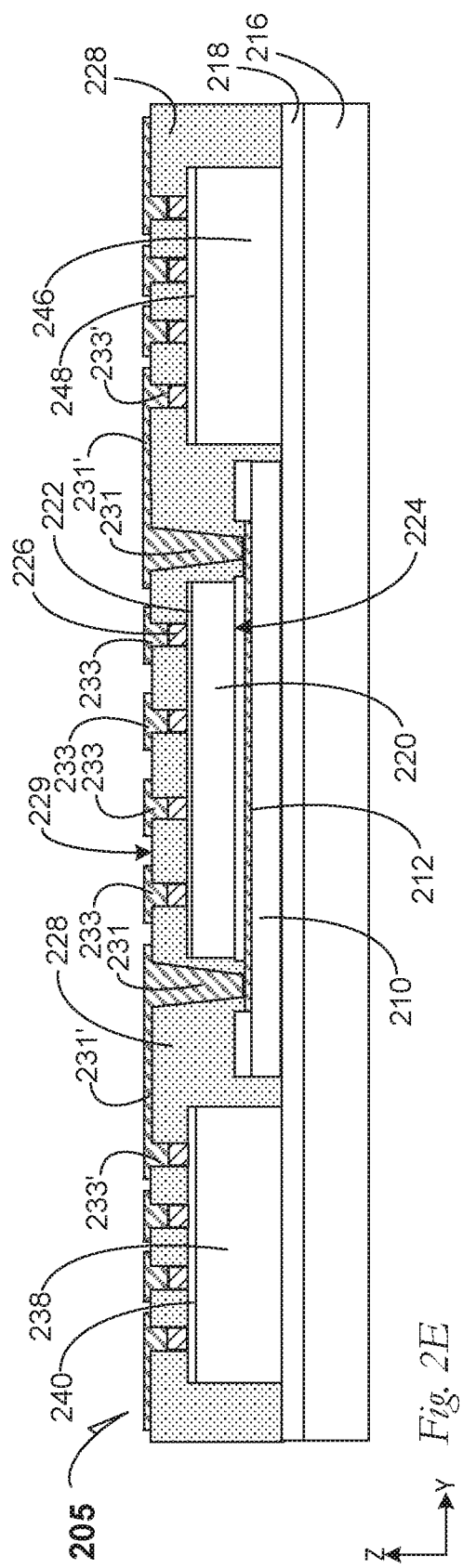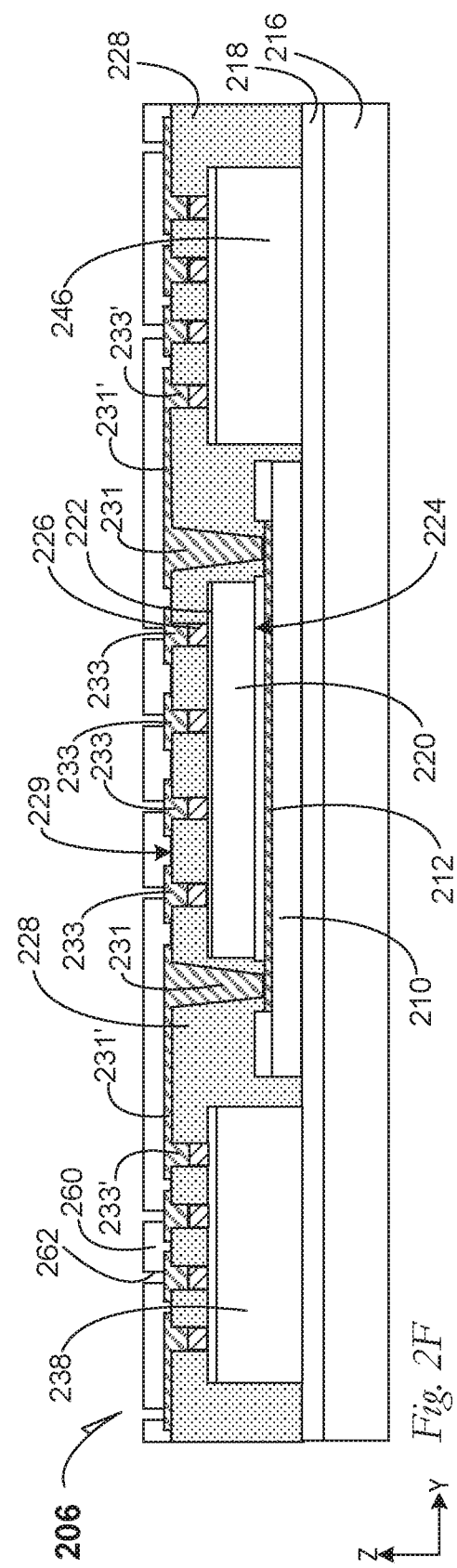

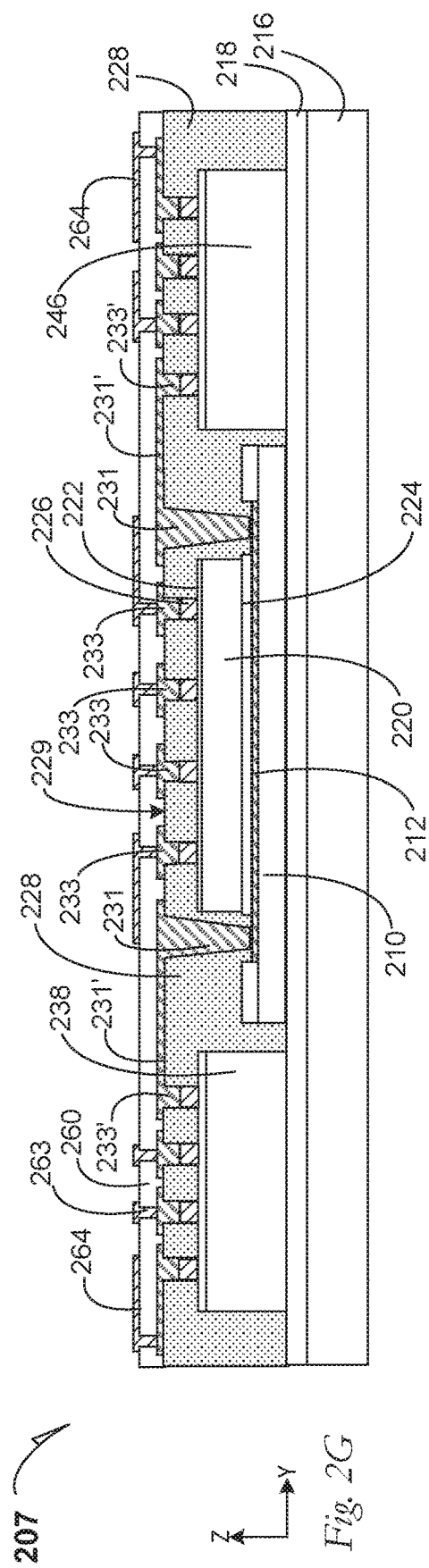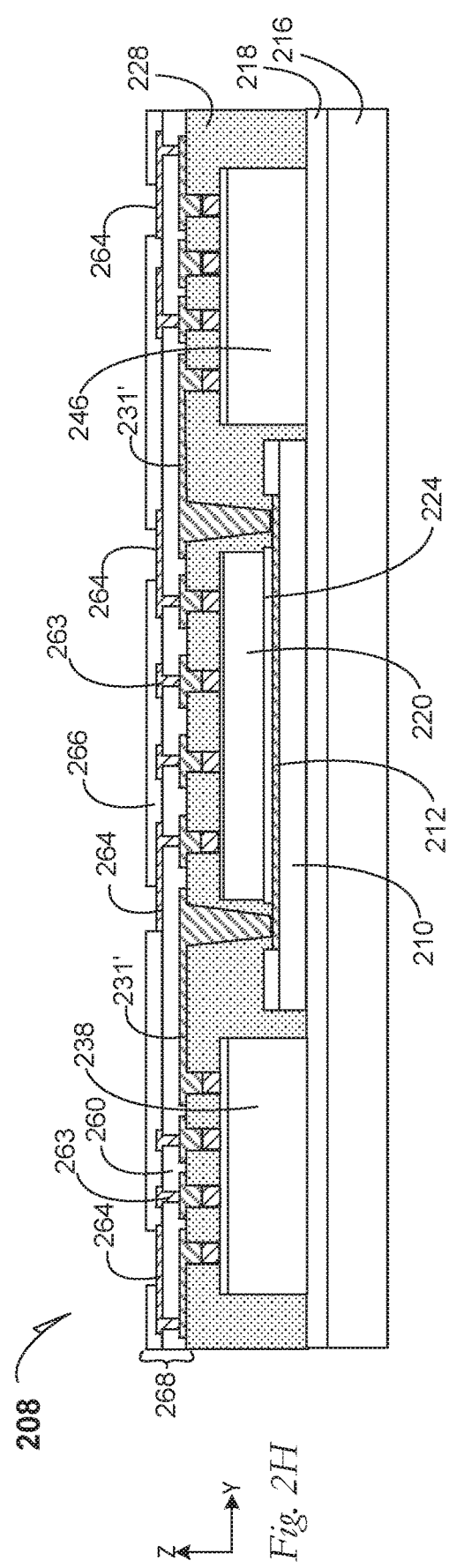

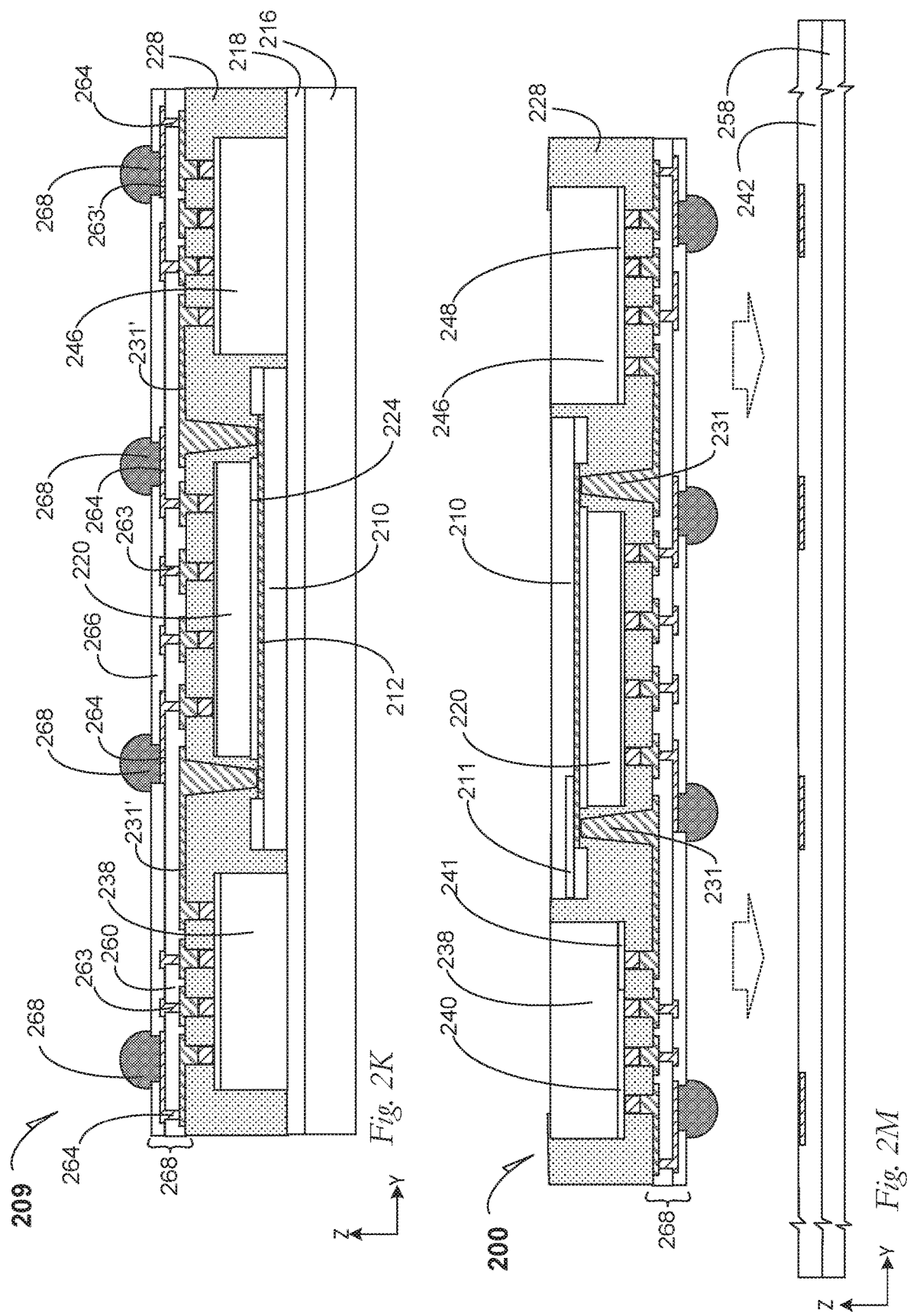

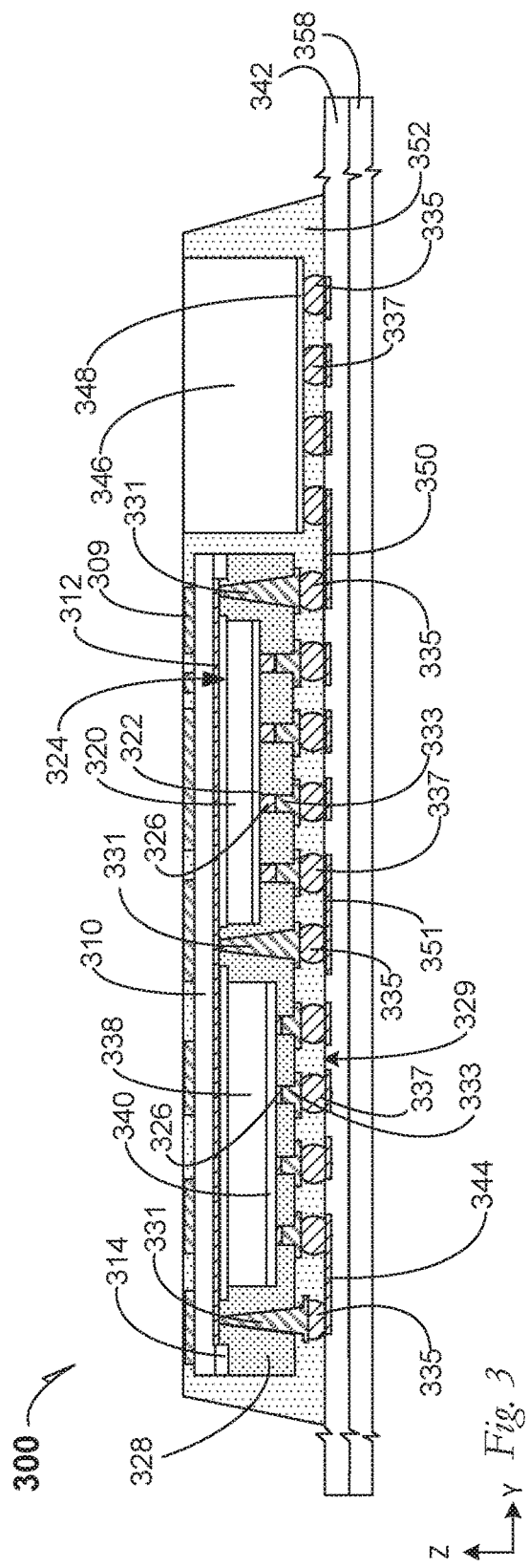
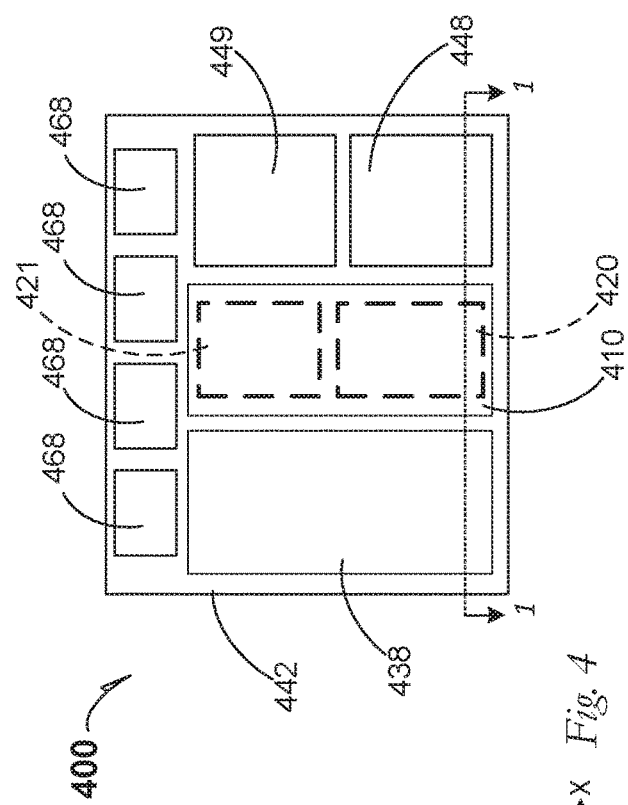

US 11,393,760 B2

FLOATING-BRIDGE INTERCONNECTS AND METHODS OF ASSEMBLING SAME

PRIORITY APPLICATION

This application is a continuation of U.S. application Ser. No. 16/284,218, filed Feb. 25, 2019, which claims the benefit of priority to Malaysian Application Serial Number PI 2018701321, filed Mar. 30, 2018, all of which are incorporated herein by reference in their entirety.

FIELD

This disclosure relates to silicon-bridge interconnects and organic-bridge interconnects that are superposed on existing semiconductive devices for increased chipset densities.

BACKGROUND

Semiconductive device miniaturization during packaging requires 2D multiple-die footprints.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1H is a cross-section elevation of a floating silicon-bridge redistribution layer in a multiple-die apparatus according to an embodiment;

FIG. 1 is a cross-section elevation of an FEMIB apparatus such as the FEMIB apparatus depicted in FIG. 1H after further processing according to an embodiment;

FIG. 2A is a cross-section elevation of a floating silicon bridge interconnect during assembly according to an embodiment;

FIG. 2B is a cross-section elevation of the floating-bridge interconnect depicted in FIG. 2A after further processing according to an embodiment;

FIG. 2C is a cross-section elevation of the floating-bridge multiple-die assembly depicted in FIG. 2B after further processing according to an embodiment;

FIG. 2D is a cross-section elevation of the floating-bridge multiple-die assembly depicted in FIG. 2C after further processing according to an embodiment;

FIG. 2E is a cross-section elevation of the floating-bridge multiple-die assembly depicted in FIG. 2D after further processing according to an embodiment;

FIG. 2F is a cross-section elevation of the floating-bridge multiple-die assembly depicted in FIG. 2E after further processing according to an embodiment;

FIG. 2G is a cross-section elevation of the floating-bridge multiple-die assembly depicted in FIG. 2F after further processing according to an embodiment;

FIG. 2H is a cross-section elevation of the floating-bridge multiple-die assembly depicted in FIG. 2G after further processing according to an embodiment;

FIG. 2K is a cross-section elevation of the floating-bridge multiple-die assembly depicted in FIG. 2H after further processing according to an embodiment;

FIG. 2M is a cross-section elevation of a floating embedded multiple-die bridge apparatus such as the FEMIB apparatus depicted in FIG. 2K after further processing according to an embodiment;

FIG. 3 is a cross-section elevation of a floating embedded multiple-die bridge apparatus according to an embodiment;

FIG. 4 is a top plan of a floating embedded multiple-die bridge apparatus according to an embodiment;

DETAILED DESCRIPTION

Floating-bridge interconnects allow for contracted-footprint semiconductive device apparatus and the contracted-footprint apparatus demonstrate faster interconnectivity and lower inductive and resistivity challenges, among others. Floating-bridge interconnects are reverse redistribution layer (RRDL) interconnects that are deployed by interconnecting two semiconductive devices such as a logic processor and a graphics processor, while the floating-bridge interconnect hovers above a middle semiconductive device. Package-substrate real estate below the middle semiconductive device remains dedicated to the semiconductive devices most proximate to the useful package-substrate real estate.

In an embodiment, a floating-bridge interconnect is made from semiconductive material, and although it may be fabricated from, e.g., silicon, III-V semiconductive material, or other semiconductive combinations, it is referred to herein as a "silicon bridge." The silicon bridge has an orientation within a semiconductor package as a silicon embedded multi-die interconnect bridge (EMIB). In an embodiment, a floating-bridge interconnect is an organic bridge that has an orientation within a semiconductor package as an organic EMIB. In any event in disclosed embodiments, the floating-bridge interconnect is positioned "above" (Z-direction) another semiconductive device in a multi-die semiconductor package, and will be referred to herein as a floating EMIB, or FEMIB. Specific embodiment applications that call for a silicon FEMIB may be used, whereas other specific embodiment applications call for an organic FEMIB. Although throughout the disclosure, reference is made to a silicon FEMIB, an organic FEMIB may also be implied or explicitly described.

Figure 1A:
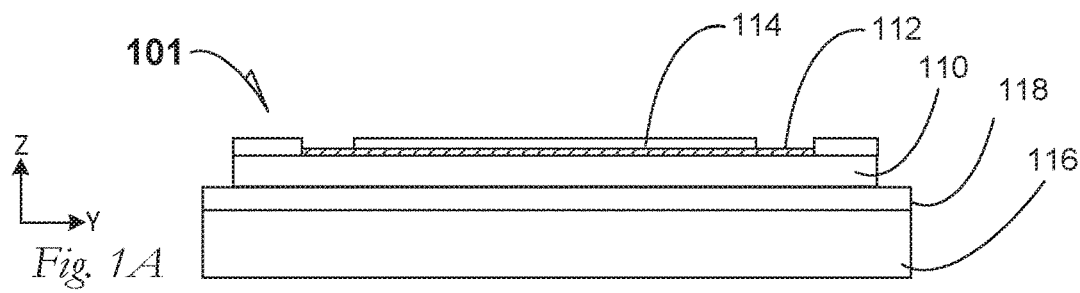
FIG. 1A is a cross-section elevation of a silicon bridge interconnect during assembly according to an embodiment.

FIG. 1A is a cross-section elevation of a silicon bridge interconnect 101 during assembly according to an embodiment. In an embodiment, a silicon-bridge semiconductive interconnect 110, which may also be referred to as an interconnect bridge 110, a bridge die 110, or a floating-bridge die 110. In an embodiment, the floating-bridge die 110 includes bridge metallization 112 that is exposed for contacting through selected openings in a solder resist 114. In an embodiment, the structure 114 is an interlayer dielectric (ILD) 114 that has an opening to expose the bridge metallization 112. In an embodiment, the FEMIB is an organic FEMIB.

Assembly of the floating-bridge die 110 is accomplished by seating upon a carrier 116 with an adhesive 118 for further processing. Where the floating-bridge die 110 is assembled to a carrier 116 such as a wafer-level carrier 116 that holds several bridge dice, the bridge die 110 may be pick-and-place assembled to the carrier 116.

Figure 1B:
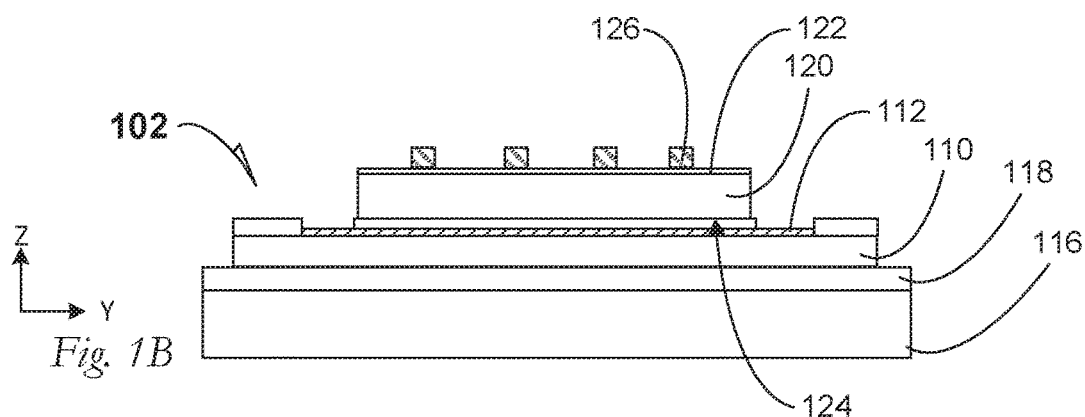
FIG. 1B is a cross-section elevation of the silicon bridge interconnect depicted in FIG. 1A after further processing according to an embodiment.

FIG. 1B is a cross-section elevation of the silicon bridge interconnect 101 depicted in FIG. 1A after further processing according to an embodiment. A multiple-die assembly 102 includes the floating-bridge die 110 and a middle semiconductive device 120 according to an embodiment. The middle semiconductive device 120 is seated on the floating-bridge die 110, and the middle semiconductive device 120 includes an active surface 122 and a backside surface 124. The active surface 122 includes active devices and metallization.

In an embodiment, the middle semiconductive device 120 includes a series of electrical bumps 126 such as copper pillars 126, which contact the active surface 122 for power- and I/O contact to neighboring structures such as other semiconductive devices and package substrates.

Figure 1C:
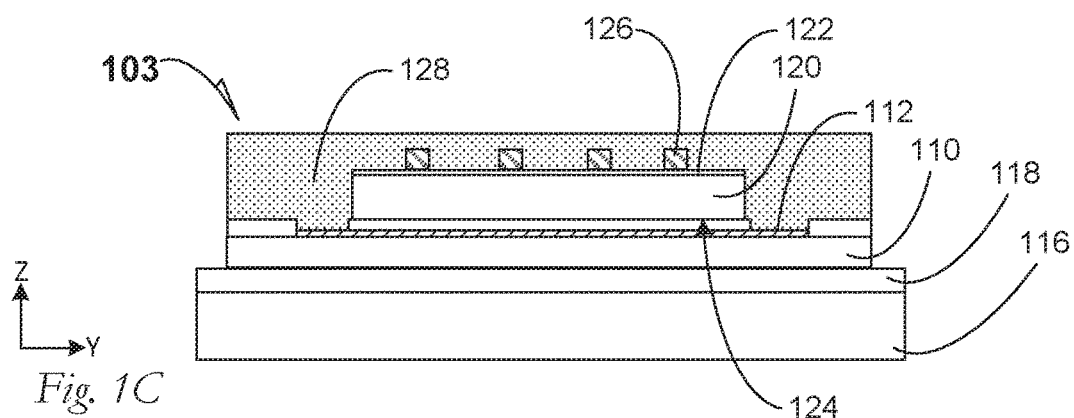
FIG. 1C is a cross-section elevation of the multiple-die assembly depicted in FIG. 1B after further processing according to an embodiment.

FIG. 1C is a cross-section elevation of the multiple-die assembly 102 depicted in FIG. 1B after further processing according to an embodiment. The multiple-die assembly 103 has been overmolded with an interlayer dielectric 128 in preparation for assembling the multiple-die assembly 103 to a package substrate.

Figure 1D:
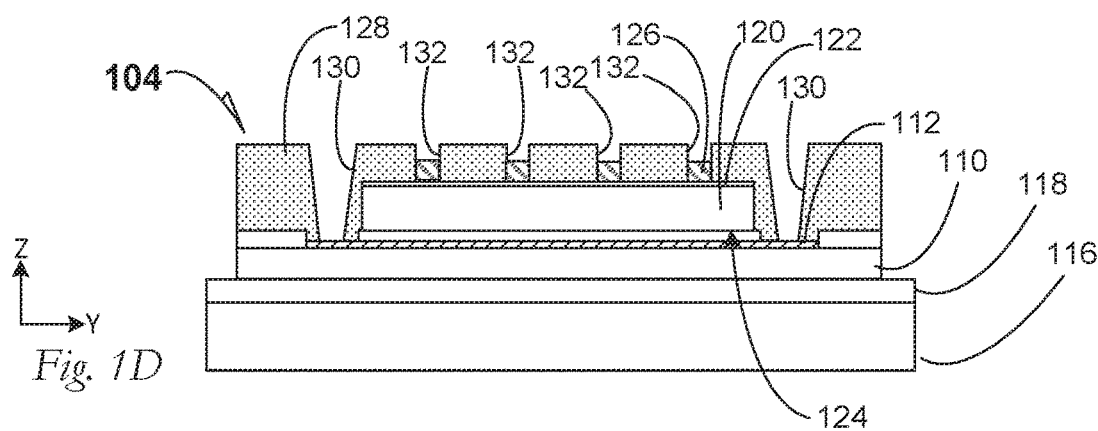
FIG. 1D is a cross-section elevation of the multiple-die assembly depicted in FIG. 1C after further processing according to an embodiment.

FIG. 1D is a cross-section elevation of the multiple-die assembly 103 depicted in FIG. 1C after further processing according to an embodiment. The multiple-die assembly 104 has been processed by opening vias in the interlayer dielectric 128. In an embodiment, a bridge-contact via 130 (two occurrences indicated) has been formed by laser drilling through the interlayer dielectric 128 to expose the bridge-die metallization 112. In an embodiment, middle semiconductive device vias 132 (four occurrences indicated) have been formed by opening the interlayer dielectric 128 to expose the middle-semiconductive device electrical bumps 126. In an embodiment, laser drilling is used to open both the vias 130 and 132. In an embodiment, directional etching is used to open both vias 130 and 132. In an embodiment, laser drilling is used to open the bridge-contact via 130, and directional etching is used to open the middle semiconductive device via 132.

Figure 1E:
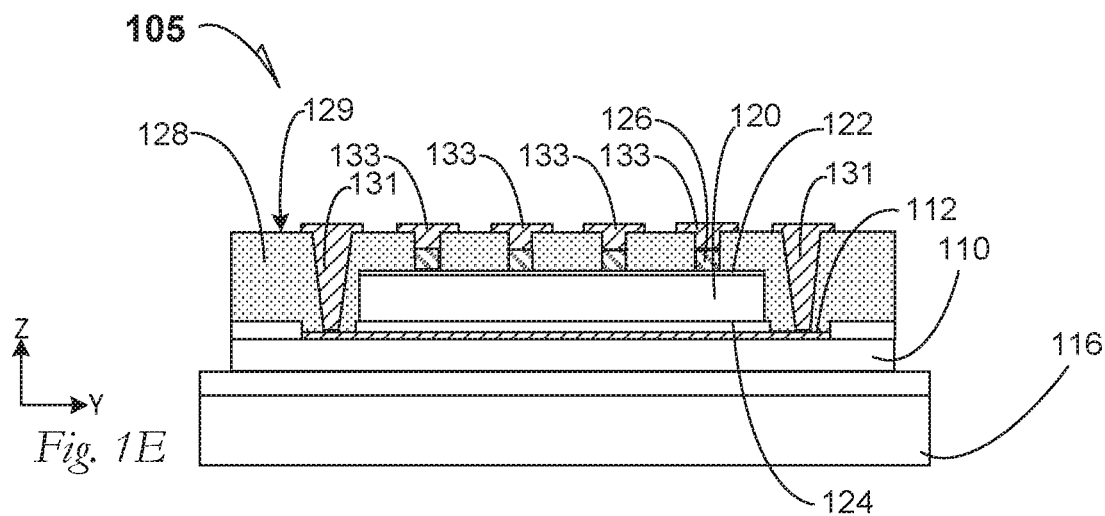
FIG. 1E is a cross-section elevation of the multiple-die assembly depicted in FIG. 1D after further processing according to an embodiment.

FIG. 1E is a cross-section elevation of the multiple-die assembly 104 depicted in FIG. 1D after further processing according to an embodiment. The multiple-die assembly 105 has been processed by filling the vias in the interlayer dielectric 128. In an embodiment, bridge-contact filled vias 131 (two occurrences indicated) have been formed by plating onto the bridge-die metallization 112.

In an embodiment, middle semiconductive device filled vias 133 (four occurrences indicated) have been formed by plating onto the middle-semiconductive device electrical bumps 126. In an embodiment, the bridge-contact filled vias 131 and the middle semiconductive device filled via 133 are plated through a mask (not illustrated) that rests on an upper surface 129 of the interlayer dielectric 128, such that a bond pad portion of each or some of the filled vias 131 and 133 also rests upon the upper surface 129.

Figure 1F:
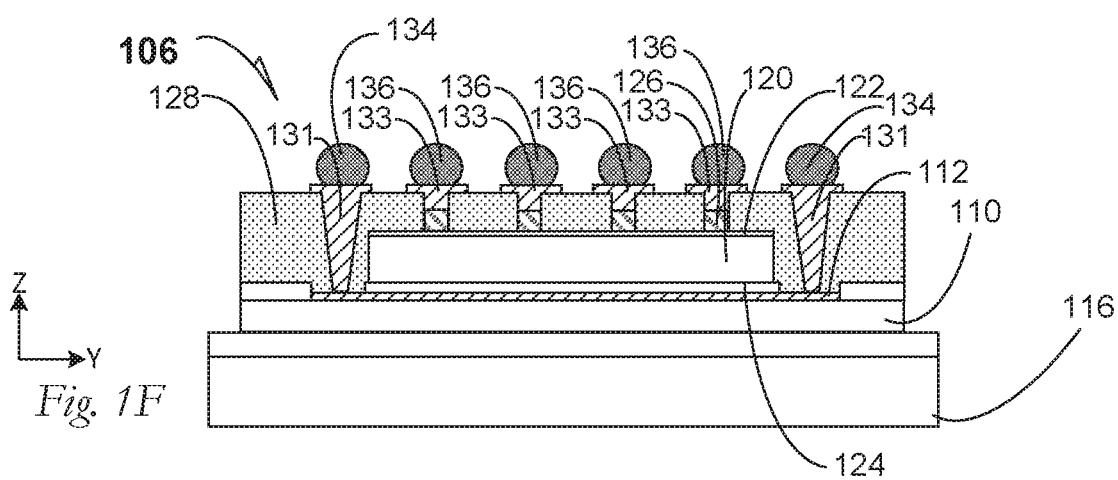
FIG. 1F is a cross-section elevation of the multiple-die assembly depicted in FIG. 1E after further processing according to an embodiment.

FIG. 1F is a cross-section elevation of the multiple-die assembly 105 depicted in FIG. 1E after further processing according to an embodiment. The multiple-die assembly 106 has been processed by forming electrical bumps 134 (two occurrences indicated) and 136 (four occurrences indicated) on the respective bridge-contact and middle semiconductive device filled vias 131 and 133. In an embodiment where center-to-center pad pitch between any two adjacent electrical bumps 136 is substantially the same as between two adjacent electrical bumps 134 and 136, forming a ball array is done by screen printing the several electrical bumps 134 and 136.

Figure 1G:
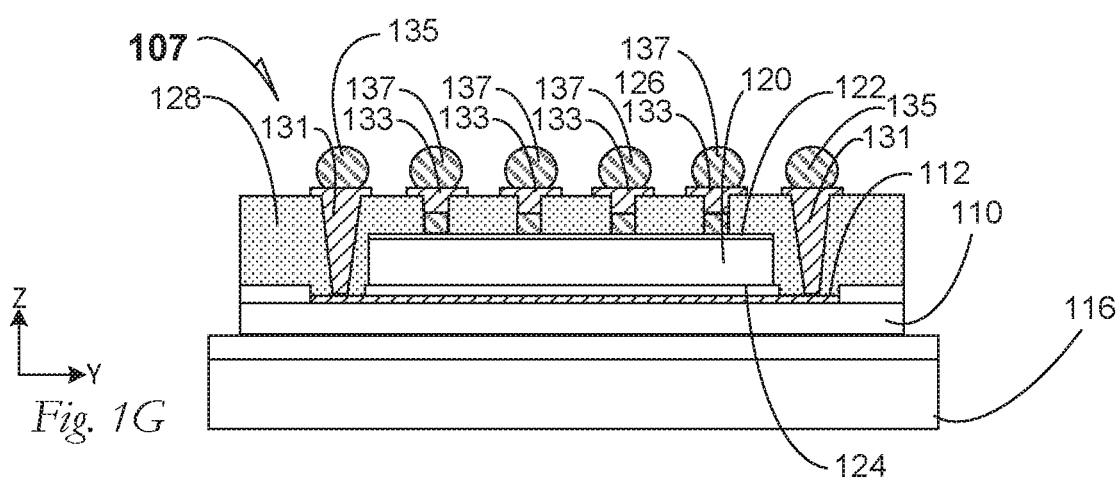
FIG. 1G is a cross-section elevation of the multiple-die assembly depicted in FIG. 1F after further processing according to an embodiment.

FIG. 1G is a cross-section elevation of the multiple-die assembly 106 depicted in FIG. 1F after further processing according to an embodiment. The multiple-die assembly 107 has been processed by reflowing the electrical bumps 134 and 136 on the respective bridge-contact and middle semiconductive device filled vias 131 and 133. In an embodiment, reflowing is reserved for later in the assembly of a floating-bridge redistribution-layer semiconductor apparatus (see, e.g., FIG. 1H).

FIG. 1H is a cross-section elevation of a floating silicon-bridge redistribution layer in a multiple-die apparatus 108 according to an embodiment. The floating silicon-bridge redistribution layer in a multiple-die apparatus 108 may also be referred to as a floating embedded multiple-die bridge apparatus (FEMIB apparatus) 108 by the configuration of the floating-bridge die 110 occupying at least some, and usually all of the X-Y footprint dimensions of a middle semiconductive device 120. In an embodiment, the floating-bridge die 110 footprint dimension occupies all of the X-Y footprint of a middle semiconductive device 120.

In an embodiment, a first semiconductive device 138 includes an active surface 140, and the first semiconductive device 138 is flip-chip mounted onto a semiconductor package substrate 142. The floating silicon-bridge die 110 is coupled to the first semiconductive device 138 by a first trace 144 on the semiconductor package substrate 142. The first trace 144 contacts an electrical bump 135 that contacts a bridge-contact filled via 131.

In an embodiment, a subsequent semiconductive device 146 includes an active surface 148, and the subsequent semiconductive device 146 is flip-chip mounted onto the semiconductor package substrate 142. The floating silicon bridge 110 is coupled to the subsequent semiconductive device 146 by a subsequent trace 150 on the semiconductor package substrate 142. The subsequent trace 150 contacts an electrical bump 135 that contacts a bridge-contact filled via 131.

The FEMIB apparatus 108 includes the first semiconductive device 138, the subsequent semiconductive device 146 and the middle semiconductive device 120, all of which are coupled to the floating-bridge die 110. In an embodiment, the floating-bridge die 110 occupies the same X-Y footprint, and more, of the middle semiconductive device 120. In an embodiment, the floating-bridge die 110 provides a high-speed interconnect between the first semiconductive device 138 and the subsequent semiconductive device 146, while not requiring lateral (X-Y) connection to be routed around the middle semiconductive device 120, and therefore not requiring more real estate on the semiconductor package substrate 142.

FIG. 1 is a cross-section elevation of an FEMIB apparatus 100 such as the FEMIB apparatus 108 depicted in FIG. 1H after further processing according to an embodiment. An encapsulation material 152 has been flowed over the several structures, including underflowing below the first semiconductive device 138, the interlayer dielectric 128 and the subsequent semiconductive device 146.

In an embodiment, useful computing functions for operating the subsequent semiconductive device 146 are off-loaded to other locations within the FEMIB apparatus 100. For example in an embodiment, where I/O for the subsequent semiconductive device 146 is needed, I/O function is off-loaded to a dedicated I/O sector 141 of the first semiconductive device 138 within the active surface 140. For example in an embodiment, where I/O for the subsequent semiconductive device 146 is needed, I/O function is off-loaded to a dedicated I/O sector 111 of the floating-bridge die 110 within the active surface 140 where the floating-bridge die 110 is a silicon bridge. For example in an embodiment, where I/O for the subsequent semiconductive device 146 is needed, I/O function is off-loaded to a dedicated I/O sector 111 of the floating-bridge 110 within a semiconductive-device implant region 111 where the floating-bridge 110 is an organic bridge. In an embodiment, off-loading of a given function from the subsequent semiconductive device 146 is useful, where the first semiconductive device 138 is a core processor such as a quad-core logic processor made by Intel Corporation of Santa Clara, Calif., and the subsequent semiconductive device 146 is a graphics processor.

In an embodiment, the first semiconductive device 138 has a first backside-profile height 139 that is measured from the mounting surface of the semiconductor package substrate 142. In an embodiment, the subsequent semiconductive device 146 has a subsequent backside-profile height 147 that is measured from the mounting surface of the semiconductor package substrate 142. In an embodiment, the floating-bridge die 110 has a backside-profile height 109 that is measured from the mounting surface of the semiconductor package substrate 142.

In an embodiment, each of the several backside-profile heights are substantially the same within the parameters of assembling the FEMIB apparatus 100. In an embodiment, each of the several backside-profile heights are quantitatively different in that they measure differently from the mounting surface of the semiconductor device substrate 142.

Where it is useful for the several backside-profile heights to be the same without the several semiconductive devices presenting the same heights, a spacer is located on at least one device at the backside. As illustrated, a first spacer 154 is seated on the first semiconductive device 138 opposite the active surface 140, to achieve a backside-profile height that is substantially the same as that of the floating bride die backside-profile height 109. Similarly, as illustrated, a subsequent spacer 156 is seated on the subsequent semiconductive device 146 opposite the active surface 148, to achieve a backside profile substantially the same as that of the floating bride die backside profile 109. In an embodiment, any given spacer is also a heat sink such as electronics-grade copper.

In an embodiment, the semiconductor package substrate 142 includes a shell 158 that provides at least one of physical and electrical-insulation protection to the FEMIB apparatus 100.

In some embodiments, FEMIB apparatus are assembled with redistribution layers (RDLs) in place of a board, such as the board 142 depicted in FIGS. 1 and 1H. In such embodiments, an RDL is assembled to a floating-bridge die, a first die, a middle die and a subsequent die, and the RDL, and the multiple-die assembly is configured for flip-package style mounting onto a board, with the RDL as the structure that connects to the board. FIGS. 2A through 2K and 2 illustrate the assembly of such embodiments.

FIG. 2A is a cross-section elevation of a floating silicon bridge interconnect 201 during assembly according to an embodiment.

In an embodiment, a floating-bridge die 210 includes bridge-die metallization 212 that is exposed for contacting through selected openings in a solder resist 214 or other structure such as a top ILD 214. In an embodiment, the FEMIB is an organic FEMIB. Hereinafter, the floating bridge 210 is referred to as a floating-bridge die 210.

Assembly of the floating-bridge die 210 is accomplished by seating the floating-bridge die 210 upon a carrier 216 with an adhesive 218 for further processing. Where the floating-bridge die 210 is assembled to a carrier 216 such as a wafer-level carrier 216 that holds several floating-bridge dice, the floating-bridge die 210 may be pick-and-place assembled to the carrier 216.

FIG. 2B is a cross-section elevation of the floating-bridge interconnect 201 depicted in FIG. 2A after further processing according to an embodiment. A floating-bridge multiple-die assembly 202 includes the floating-bridge die 210, a middle semiconductive device 220, a first semiconductive device 238 and a subsequent semiconductive device 246 according to an embodiment. The middle semiconductive device 220 is seated on the floating-bridge die 210, and the middle semiconductive device 220 includes an active surface 222 and a backside surface 224. The active surface 222 includes active devices and metallization. The first semiconductive device 238 includes an active surface 240, and a backside surface, which is opposite the active surface 240, and the backside surface is seated on the adhesive 218. The subsequent semiconductive device 246 includes an active surface 248, and a backside surface, which is opposite the active surface 248, and the backside is seated on the adhesive 218.

In an embodiment, the middle semiconductive device 220 includes a series of electrical bumps 226 such as copper pillars 226, which contact the active surface 222 for power- and I/O contact to neighboring structures such as other semiconductive devices and package substrates.

FIG. 2C is a cross-section elevation of the floating-bridge multiple-die assembly 202 depicted in FIG. 2B after further processing according to an embodiment. The floating-bridge multiple-die assembly 203 has been overmolded with an interlayer dielectric 228 in preparation for assembling the floating-bridge multiple-die assembly 203 to a redistribution layer.

FIG. 2D is a cross-section elevation of the floating-bridge multiple-die assembly 203 depicted in FIG. 2C after further processing according to an embodiment. The floating-bridge multiple-die assembly 204 has been processed by opening vias in the interlayer dielectric 228. In an embodiment, bridge-contact vias 230 (two occurrences indicated) have been formed by laser drilling through the interlayer dielectric 228 to expose the bridge-die metallization 212. In an embodiment, middle semiconductive device vias 232 (four occurrences indicated) have been formed by opening the interlayer dielectric 228 to expose the middle-semiconductive device electrical bumps 226. In an embodiment, laser drilling is used to open both the vias 230 and 232. In an embodiment, directional etching is used to open both vias 230 and 232. In an embodiment, laser drilling is used to open the bridge-contact via 230, and directional etching is used to open the middle semiconductive device via 232.

Device vias for the respective first and subsequent devices are opened in the interlayer dielectric 228 such as the device vias 232 for the middle semiconductive device 220.

FIG. 2E is a cross-section elevation of the floating-bridge multiple-die assembly 204 depicted in FIG. 2D after further processing according to an embodiment. The multiple-die assembly 205 has been processed by filling the vias in the interlayer dielectric 228. In an embodiment, bridge-contact filled vias 231 (two occurrences indicated) have been formed by plating onto the bridge-die metallization 212. In an embodiment, middle semiconductive device filled vias 233 (four occurrences depicted) have been formed by plating onto the middle-semiconductive device electrical bumps 226. In an embodiment, the bridge-contact filled vias 231 and the middle semiconductive device filled vias 233 are plated through a mask (not illustrated) that rests on an upper surface 229 of the interlayer dielectric 228, such that a bond pad portion of the filled vias 231 and 233 also rests upon the upper surface 229.

In an embodiment, plating to form the filled bridge-contact vias 231 also accomplishes an integral trace 231' and an integral first semiconductive-device filled via 233' for the first semiconductive device 238. In an embodiment, plating to form the filled bridge-contact vias 231, also accomplishes an integral trace 231' and a subsequent semiconductive-device filled via 233' for the subsequent semiconductive device 246. For such integral traces, both the filled vias and the trace are an integral structure due to via-and-trace forming being done in a single plating-and-via-filling technique, such that metallurgical microscopic analysis shows a uniformity of grain structure at any chosen transition zone between the trace and the filled vias.

In an embodiment, the illustrated filled vias 231, integral traces 231', filled vias 233 and integral filled vias 233' are a first portion of a redistribution layer (RDL) that is formed integral to connecting the floating-bridge die 210 and the several embedded semiconductive devices 220, 238 and 246.

FIG. 2F is a cross-section elevation of the floating-bridge multiple-die assembly 205 depicted in FIG. 2E after further processing according to an embodiment. The floating-bridge multiple-die assembly 206 has been processed by forming a second interlayer dielectric layer (IDL) 260 on the molded IDL 228, and by patterning the second IDL 260 to form interconnect vias 262 (one interconnect via enumerated) to communicate to selected filled vias 233 that were formed in the original ILD 228 and on the upper surface 229.

It is observed that some of the filled vias 233 are exposed through via openings in the second IDL 260, but other filled vias are blinded off as they are incidentally not making vertical contact in the illustrated cross section.

FIG. 2G is a cross-section elevation of the floating-bridge multiple-die assembly 206 depicted in FIG. 2F after further processing according to an embodiment. The floating-bridge multiple-die assembly 207 has been processed by a plating technique that is done to form a second filled via 263 as well as a second filled via and integral trace 264. In an embodiment where the second filled via and integral trace 264 are completed, the second integral trace 264 acts as a bond pad for flip-package mounting the floating-bridge multiple-die assembly 207.

FIG. 2H is a cross-section elevation of the floating-bridge multiple-die assembly 207 depicted in FIG. 2G after further processing according to an embodiment. After forming the second filled vias 263 and the incidental second via and integral traces 264, a subsequent IDL 266 is formed and patterned according to an embodiment. As depicted, two IDLs 260 and 266 are present with the redistribution layer 268 that is being fabricated. In an embodiment, a three-IDL structure is useful depending upon a given application, and the subsequent ILD is the last ILD on top of the floating-bridge multiple-die assembly 206. In an embodiment, a four-IDL structure is useful depending upon a given application, and the subsequent ILD is the last ILD on top of the floating-bridge multiple-die assembly 206.

FIG. 2K is a cross-section elevation of the floating-bridge multiple-die assembly 208 depicted in FIG. 2H after further processing according to an embodiment. Items 2I and 2J are omitted. After forming the subsequent IDL 266, electrical bumps 268 (four occurrences depicted) are formed on the integral traces 263'. The electrical bumps 268 are prepared as land-side bumps, where the floating-bridge multiple-die assembly 209 is prepared as a flip-package apparatus for flip-chip style mounting upon a board such as a motherboard.

FIG. 2M is a cross-section elevation of an FEMIB apparatus 200 such as the FEMIB apparatus 209 depicted in FIG. 2K after further processing according to an embodiment. Item 2L is omitted. The molded interlayer dielectric 228 acts as a package barrier and the FEMIB apparatus 200 is "flip-package" being assembled to a board 242. The molded interlayer dielectric 228 contains the first semiconductive device 238, the subsequent semiconductive device 246, the middle semiconductive device 220 and the floating-bridge interconnect 210. The molded interlayer dielectric 228 also defines the boundaries of the RDL 268 that allows the FEMIB apparatus 200, as a flip package, to be directly mounted onto the board 242. In an embodiment, the board 242 includes a shell 258 that provides at least one of physical and electrical-insulation protection to the FEMIB apparatus 200.

In an embodiment, useful computing functions for operating the subsequent semiconductive device 246 are off-loaded to other locations within the FEMIB apparatus 200. For example in an embodiment, where I/O for the subsequent semiconductive device 246 is needed, it is off-loaded to a dedicated I/O sector 241 of the first semiconductive device 238 within the active surface 240. For example in an embodiment, where I/O for the subsequent semiconductive device 246 is needed, it is off-loaded to a dedicated I/O sector 211 of the floating-bridge die 210 within the active surface 240 where the floating-bridge die 210 is a silicon bridge. For example in an embodiment, where I/O for the subsequent semiconductive device 246 is needed, it is off-loaded to a dedicated I/O sector 211 of the floating-bridge 210 within a semiconductive-device implant region 211 where the floating-bridge 210 is an organic bridge. In an embodiment, off-loading of a given function from the subsequent semiconductive device 246 is useful where the first semiconductive device 238 is a core processor, and the subsequent semiconductive device 246 is a graphics processor.

In an embodiment, the first semiconductive device 238 has a first backside-profile height above the RDL 268 at the mounting surface, and the subsequent semiconductive device 246 has a subsequent backside-profile height above the RDL 268 at the mounting surface, and similarly to the depictions illustrated in FIG. 1, the two backside-profile heights are quantitatively different. Similarly, where the two backside-profile heights are quantitatively different, appropriate-height spacers may be used to form an essentially planar presentation in the Z-direction that matches the backside-profile height of the interconnect bridge 210.

FIG. 3 is a cross-section elevation of an FEMIB apparatus 300 according to an embodiment. Production of the FEMIB apparatus 300 is done with processes similar to the FEMIB apparatus 100 that is assembled as illustrated from FIGS. 1A through 1H and FIG. 1. Process similarities include processing a first semiconductor device 338 and a middle semiconductive device 320 in the instant figure, as the middle semiconductive device 120 is processed from FIGS. 1A through 1H.

In an embodiment, a silicon bridge semiconductive interconnect 310, which may also be referred to as bridge die 310, or a floating-bridge die 310, includes bridge-die metallization 312 that is exposed for contacting through selected openings in a solder resist 314. Assembly of the bridge die 310 is accomplished by seating upon a carrier (see e.g., carrier 116 in FIG. 1A) with an adhesive for further processing. In an embodiment where the floating bridge 310 is an organic floating bridge 310, metallization 312 is complemented by opposite-side metallization 309 that is indicative of useful traces and bond pads were applicable.

The FEMIB apparatus 300 includes the bridge die 310, a first semiconductive device 338 and a middle semiconductive device 320 that are assembled to the solder resist 314 that partially covers the bridge die 310 according to an embodiment.

The middle semiconductive device 320 is seated on the bridge die 310, and the middle semiconductive device 320 includes an active surface 322 and a backside surface 324. The active surface 322 includes active devices and metallization. In an embodiment, the middle semiconductive device 320 includes a series of electrical bumps 326 such as copper pillars 326, which contact the active surface 322 for power- and I/O contact to neighboring structures such as other semiconductive devices and package substrates.

A first semiconductive device 338 is also seated on the bridge die 310, and the first semiconductive device 338 includes an active surface 340 and a backside surface. In an embodiment, the first semiconductive device 338 has a series of electrical bumps that are similar to the series of electrical bumps 326 on the middle semiconductor device 320. In an embodiment where the first and middle semiconductive devices have different Z-thicknesses, the electrical bumps 326 have different heights that stand off from the respective active surface 340 and 322.

In an embodiment, the first semiconductive device 338 and the middle semiconductive device 320 have been overmolded with an interlayer dielectric 328. In an embodiment, filled bridge-contact vias 331 (three occurrences indicated) have been formed by laser drilling through the interlayer dielectric 328 to expose the bridge-die metallization 312. In an embodiment, middle semiconductive device filled via 333 (four occurrences depicted) have been formed by opening the interlayer dielectric 328 to expose the middle-semiconductive device electrical bumps 326.

Similarly with respect to the first semiconductive device 338, first semiconductive device filled vias 333 (four occurrences depicted) have been formed by opening the interlayer dielectric 328 to expose the first-semiconductive device electrical bumps 326. In an embodiment, where the respective first and middle semiconductive devices 338 and 320 have differing thicknesses, the electrical bumps 326 have different heights with respect to the filled vias 333.

In an embodiment, the bridge-contact filled via 331 and the respective first and middle semiconductive device filled vias 333 are plated through a mask (not illustrated) that rests on a surface 329 of the interlayer dielectric 328, such that a bond pad portion of the filled vias 331 and 333 also rests upon the upper surface 329.

In an embodiment, the FEMIB apparatus 300 is processed to form electrical bumps 335 (three occurrences indicated) that contact the bridge-contact filled vias 331, and electrical bumps 337 (four occurrences for each device depicted) that couple to the respective first and middle semiconductive devices 338 and 320, as well as to a subsequent semiconductive device 346.

In an embodiment, the subsequent semiconductive device 346 includes an active surface 348 and the active surface 148 is also in contact with several electrical bumps 337 (four occurrences depicted). In an embodiment, the subsequent semiconductive device 346 has a vertical (Z-direction) profile that reaches at least as high as the FEMIB 310. In an embodiment, the FEMIB 310, the middle semiconductive device 320, the first semiconductive device 338 and the subsequent semiconductive device 346 are assembled to a board 342 such as a motherboard 342. In an embodiment, the first semiconductive device 346 and the middle semiconductive device are assembled to the board 342 as a "flip-package" and the subsequent semiconductive device 346 is flip-chip assembled to the board.

In an embodiment, the floating silicon bridge 310 is coupled to the first semiconductive device 338 by a first trace 344 on the board 342. In an embodiment, the floating silicon bridge 310 is coupled to the middle semiconductive device 320 by a middle trace 351 on the board 342. In an embodiment, the floating silicon bridge 310 is coupled to the subsequent semiconductive device 338 by a subsequent trace 350 on the board 342.

In an embodiment, the FEMIB 310 occupies at least some, and usually all of the X-Y footprint of the respective first and middle semiconductive devices 338 and 320.

In an embodiment, a first semiconductive device 138 includes an active surface 140, and the first semiconductive device 138 is flip-chip mounted onto a semiconductor package substrate 142. The floating silicon bridge 110 is coupled to the first semiconductive device 138 by a first trace 144 on the semiconductor package substrate 142. The first trace 144 contacts a bond pad 135 that contacts a bridge-contact filled via 131.

In an embodiment, the board 342 includes a shell 358 that acts as at least one of a physical and electrically insulative barrier to protect the FEMIB apparatus 300.

FIG. 4 is a top plan of a FEMIB apparatus 400 according to an embodiment. In an embodiment, analogous semiconductive devices depicted for the FEMIB apparatus 100 depicted in FIG. 1 are shown in cross-section, taken along the section line 1-1 are depicted in FIG. 4.

In an embodiment, a floating bridge 410 overshadows a middle semiconductive device 420, and a first and a subsequent semiconductive device 438 and 448 are coupled through the floating bridge 410. In an embodiment, a fourth semiconductive device 449 is also coupled to the first semiconductive device 438 through the floating bridge 410. Additionally in an embodiment a subsequent middle semiconductive device 421 is overshadowed by floating bridge 410, and the fourth semiconductive device 449 is also coupled to the first semiconductive device 438 through the floating bridge 410. By use of the floating bridge 410, useful real estate on a board 442 is preserved for indigenous interconnect requirements of the several devices 438, 448, 449, 420 and 421, and overall size of the board 442 is smaller than needed without the floating bridge 410.

In an embodiment, a series of memory devices 468 are assembled on the board 442. Electrical interconnection is accomplished through the floating bridge 410 between the first semiconductive device 438 and the several memory devices 468. In an embodiment, the series of memory devices is limited to 16 (where four are indicated in FIG. 4).

In an embodiment, item 442 is an RDL 442 that is manufactured similarly to the RDL 268 depicted in FIG. 2M.

Figure 5:
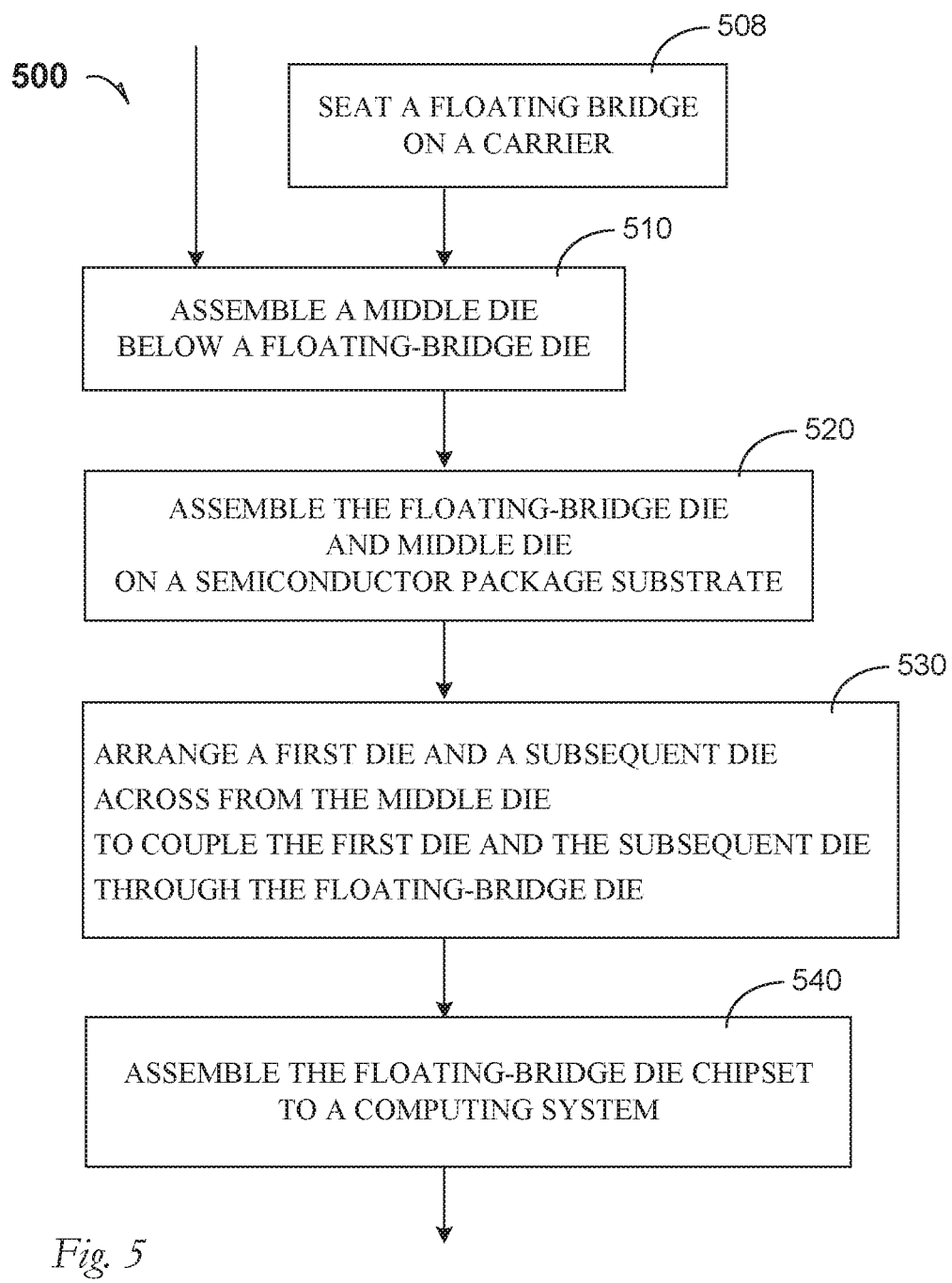
FIG. 5 is a process flow diagram according to several embodiments.

FIG. 5 is a process flow diagram according to several embodiments.

At 510, the process includes assembling a middle die to a floating bridge die.

In an embodiment at 508, the process at 510 is preceded with assembling the floating bridge die to a carrier.

At 520, the process includes assembling the floating bridge die the middle die to a semiconductor package substrate.

At 530, the process includes arranging a first die and a subsequent die across from the middle die to couple the first die and the subsequent die through the floating-bridge die.

At 540, the process includes assembling the floating-bridge die chipset to a computing system.

Figure 6:
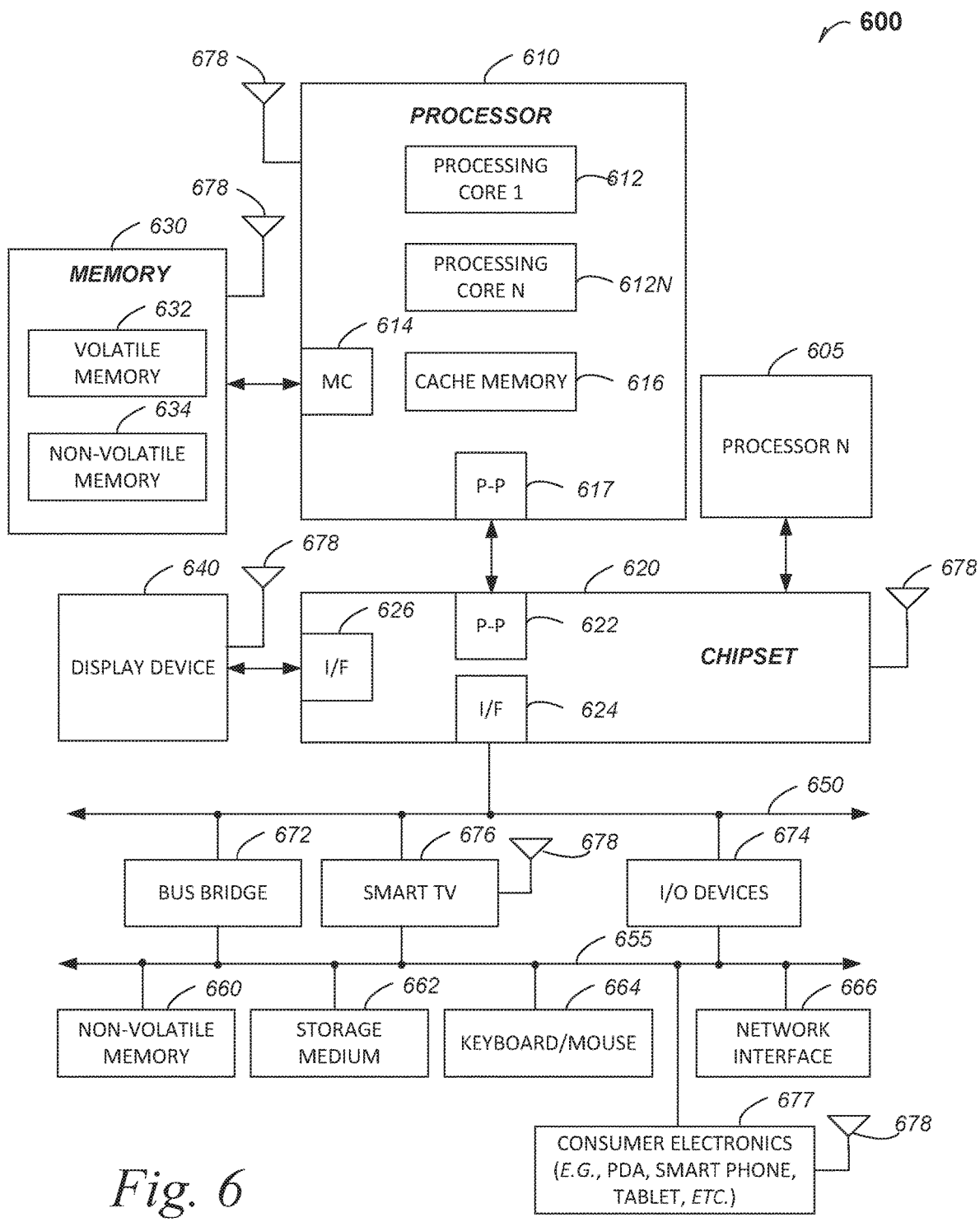
FIG. 6 is included to show an example of a higher-level device application for the disclosed embodiments.

FIG. 6 is included to show an example of a higher-level device application for the disclosed embodiments. The floating embedded-bridge multiple-device apparatus embodiments may be found in several parts of a computing system. In an embodiment, the floating embedded-bridge multi-die apparatus embodiments can be part of a communications apparatus such as is affixed to a cellular communications tower. In an embodiment, a computing system 600 includes, but is not limited to, a desktop computer. In an embodiment, a system 600 includes, but is not limited to a laptop computer. In an embodiment, a system 600 includes, but is not limited to a tablet. In an embodiment, a system 600 includes, but is not limited to a notebook computer. In an embodiment, a system 600 includes, but is not limited to a personal digital assistant (PDA). In an embodiment, a system 600 includes, but is not limited to a server. In an embodiment, a system 600 includes, but is not limited to a workstation. In an embodiment, a system 600 includes, but is not limited to a cellular telephone. In an embodiment, a system 600 includes, but is not limited to a mobile computing device. In an embodiment, a system 600 includes, but is not limited to a smart phone. In an embodiment, a system 600 includes, but is not limited to an internet appliance. Other types of computing devices may be configured with the microelectronic device that includes FEMIB apparatus embodiments.

In an embodiment, the processor 610 has one or more processing cores 612 and 612N, where 612N represents the Nth processor core inside processor 610 where N is a positive integer. In an embodiment, the electronic device system 600 using a floating embedded-bridge multi-die apparatus embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the multi-layer solder resist on a semiconductor device package substrate in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. In an embodiment, the chipset 620 is part of a floating embedded-bridge multi-die apparatus embodiment depicted in any of FIGS. 1-4. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), cross-point memory or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a floating embedded-bridge multi-die apparatus embodiment as set forth in this disclosure. The chipset 620 enables the processor 610 to connect to other elements in a floating embedded-bridge multi-die apparatus embodiment in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In an embodiment, the processor 610 and the chipset 620 are merged into a floating embedded-bridge multi-die apparatus embodiment in a system. Additionally, the chipset 620 connects to one or more buses 650 and 655 that interconnect various elements 674, 660, 662, 664, and 666. Buses 650 and 655 may be interconnected together via a bus bridge 672 such as at least one floating embedded-bridge multi-die apparatus embodiment. In an embodiment, the chipset 620, via interface 624, couples with a non-volatile memory 660, a mass storage device(s) 662, a keyboard/mouse 664, a network interface 666, smart TV 676, and the consumer electronics 677, etc.

In an embodiment, the mass storage device 662 includes, but is not limited to, a solid-state drive, a hard disk drive, a universal serial bus flash memory drive, or any other form of computer data storage medium. In one embodiment, the network interface 666 is implemented by any type of wellknown network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the floating embedded-bridge multi-die apparatus embodiments in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

To illustrate the floating embedded-bridge multi-die apparatus embodiments and methods disclosed herein, a non-limiting list of examples is provided herein:

Example 1 is a semiconductor apparatus, comprising: an interconnect bridge, wherein the interconnect bridge includes a footprint dimension; a middle semiconductive device positioned within the interconnect-bridge footprint dimension; a first semiconductive device and a subsequent semiconductive device positioned across the middle semiconductive device, wherein the first semiconductive device and the subsequent semiconductive device are coupled through the interconnect bridge.

In Example 2, the subject matter of Example 1 optionally includes a semiconductor package substrate onto which the first semiconductive device, the middle semiconductive device and the subsequent semiconductive device are mounted, and wherein the interconnect bridge is suspended above the semiconductor package substrate.

In Example 3, the subject matter of any one or more of Examples 1-2 optionally include a semiconductor package substrate onto which the first semiconductive device, the middle semiconductive device and the subsequent semiconductive device are mounted, wherein the interconnect bridge is suspended above the semiconductor package substrate, and wherein the interconnect bridge is a bridge including semiconductive material.

In Example 4, the subject matter of any one or more of Examples 1-3 optionally include a semiconductor package substrate onto which the first semiconductive device, the middle semiconductive device and the subsequent semiconductive device are mounted, wherein the interconnect bridge is suspended above the semiconductor package substrate, and wherein the interconnect bridge is a bridge including organic material.

In Example 5, the subject matter of any one or more of Examples 1-4 optionally include a semiconductor package substrate onto which the first semiconductive device, the middle semiconductive device and the subsequent semiconductive device are mounted, and wherein the interconnect bridge is suspended above the semiconductor package substrate; an interlayer dielectric that at least partially encapsulates the middle semiconductive device; a bridge-interconnect filled via that penetrates the interlayer dielectric to contact the interconnect bridge; and a filled via that penetrates the interconnect layer dielectric to contact the middle semiconductive device.

In Example 6, the subject matter of any one or more of Examples 1-5 optionally include a semiconductor package substrate onto which the first semiconductive device, the middle semiconductive device and the subsequent semiconductive device are mounted, and wherein the interconnect bridge is suspended above the semiconductor package substrate; an interlayer dielectric that at least partially encapsulates the middle semiconductive device; a first bridge-interconnect filled via that penetrates the interlayer dielectric to contact the interconnect bridge; a first trace on the semiconductor package substrate that contacts the interconnect bridge and that couples the first semiconductive device to the interconnect bridge; a subsequent bridge-interconnect filled via that penetrates the interlayer dielectric to contact the interconnect bridge; and a subsequent trace on the semiconductor package substrate that contacts the interconnect bridge and that couples the subsequent semiconductive device to the interconnect bridge.

In Example 7, the subject matter of any one or more of Examples 1-6 optionally include a semiconductor package substrate onto which the first semiconductive device, the middle semiconductive device and the subsequent semiconductive device are mounted, and wherein the interconnect bridge is suspended above the semiconductor package substrate; an interlayer dielectric that at least partially encapsulates the middle semiconductive device; a first bridge-interconnect filled via that penetrates the interlayer dielectric to contact the interconnect bridge; a first trace on the semiconductor package substrate that contacts the interconnect bridge and that couples the first semiconductive device to the interconnect bridge; a subsequent bridge-interconnect filled via that penetrates the interlayer dielectric to contact the interconnect bridge; a subsequent trace on the semiconductor package substrate that contacts the interconnect bridge and that couples the subsequent semiconductive device to the interconnect bridge; and an encapsulation material that contacts the semiconductor package substrate, the first semiconductive device, the interlayer dielectric, the interconnect bridge and the subsequent semiconductive device.

In Example 8, the subject matter of any one or more of Examples 1-7 optionally include a semiconductor package substrate onto which the first semiconductive device, the middle semiconductive device and the subsequent semiconductive device are mounted, and wherein the interconnect bridge is suspended above the semiconductor package substrate; an interlayer dielectric that at least partially encapsulates the middle semiconductive device; a first bridge-interconnect filled via that penetrates the interlayer dielectric to contact the interconnect bridge; a first trace on the semiconductor package substrate that contacts the interconnect bridge and that couples the first semiconductive device to the interconnect bridge; a subsequent bridge-interconnect filled via that penetrates the interlayer dielectric to contact the interconnect bridge; a subsequent trace on the semiconductor package substrate that contacts the interconnect bridge and that couples the subsequent semiconductive device to the interconnect bridge; an encapsulation material that contacts the semiconductor package substrate, the first semiconductive device, the interlayer dielectric, the interconnect bridge and the subsequent semiconductive device; and wherein the first semiconductive device presents a first backside-profile height above the semiconductor package substrate, the subsequent semiconductive device presents a subsequent backside-profile height above the semiconductor package substrate, and wherein the first backside-profile height and the subsequent backside-profile height are quantitatively different.

In Example 9, the subject matter of any one or more of Examples 1-8 optionally include wherein a computing function for the subsequent semiconductive device is located within a sector in the first semiconductive device.

In Example 10, the subject matter of any one or more of Examples 1-9 optionally include wherein a computing function for the subsequent semiconductive device is located within a sector in the interconnect bridge.

In Example 11, the subject matter of any one or more of Examples 1-10 optionally include a redistribution layer onto which the first semiconductive device, the middle semiconductive device and the subsequent semiconductive device are mounted, and wherein the interconnect bridge is suspended above the redistribution layer and the middle semiconductive device.

In Example 12, the subject matter of Example 11 optionally includes wherein the interconnect bridge is a bridge including semiconductive material.

In Example 13, the subject matter of any one or more of Examples 11-12 optionally include and wherein the interconnect bridge is a bridge including organic material.

In Example 14, the subject matter of any one or more of Examples 11-13 optionally include an interlayer dielectric that at least partially encapsulates the first semiconductive device, the middle semiconductive device, the interconnect bridge and the subsequent semiconductive device; a bridge-interconnect filled via that penetrates the interlayer dielectric to contact the interconnect bridge; and a filled via that penetrates the interconnect layer dielectric to contact the middle semiconductive device.

In Example 15, the subject matter of any one or more of Examples 11-14 optionally include an interlayer dielectric that at least partially encapsulates the first semiconductive device, the middle semiconductive device, the interconnect bridge and the subsequent semiconductive device; a first bridge-interconnect filled via that penetrates the interlayer dielectric to contact the interconnect bridge; a first trace on the semiconductor package substrate that contacts the interconnect bridge and that couples the first semiconductive device to the interconnect bridge, and wherein the first bridge-interconnect filled via and the first trace are an integral structure; a subsequent bridge-interconnect filled via that penetrates the interlayer dielectric to contact the interconnect bridge; and a subsequent trace on the semiconductor package substrate that contacts the interconnect bridge and that couples the subsequent semiconductive device to the interconnect bridge, and wherein the subsequent bridge-interconnect filled via are an integral structure.

In Example 16, the subject matter of any one or more of Examples 11-15 optionally include an interlayer dielectric that at least partially encapsulates the first semiconductive device, the middle semiconductive device, the interconnect bridge and the subsequent semiconductive device; an interlayer dielectric that at least partially encapsulates the middle semiconductive device; a first bridge-interconnect filled via that penetrates the interlayer dielectric to contact the interconnect bridge; a first trace on the semiconductor package substrate that contacts the interconnect bridge and that couples the first semiconductive device to the interconnect bridge, and wherein the first bridge-interconnect filled via and the first trace are an integral structure; a subsequent bridge-interconnect filled via that penetrates the interlayer dielectric to contact the interconnect bridge; a subsequent trace on the semiconductor package substrate that contacts the interconnect bridge and that couples the subsequent semiconductive device to the interconnect bridge, and wherein the subsequent bridge-interconnect filled via and the subsequent trace are an integral structure; and an encapsulation material that contacts the semiconductor package substrate, the first semiconductive device, the interlayer dielectric, the interconnect bridge and the subsequent semiconductive device.

In Example 17, the subject matter of any one or more of Examples 11-16 optionally include an interlayer dielectric that at least partially encapsulates the first semiconductive device, the middle semiconductive device, the interconnect bridge and the subsequent semiconductive device; an interlayer dielectric that at least partially encapsulates the middle semiconductive device; a first bridge-interconnect filled via that penetrates the interlayer dielectric to contact the interconnect bridge; a first trace on the semiconductor package substrate that contacts the interconnect bridge and that couples the first semiconductive device to the interconnect bridge; a subsequent bridge-interconnect filled via that penetrates the interlayer dielectric to contact the interconnect bridge; a subsequent trace on the semiconductor package substrate that contacts the interconnect bridge and that couples the subsequent semiconductive device to the interconnect bridge; an encapsulation material that contacts the semiconductor package substrate, the first semiconductive device, the interlayer dielectric, the interconnect bridge and the subsequent semiconductive device; and wherein the first semiconductive device presents a first backside-profile height above the redistribution layer, the subsequent semiconductive device presents a subsequent backside-profile height above the redistribution layer, and wherein the first backside-profile height and the subsequent backside-profile height are quantitatively different.

In Example 18, the subject matter of any one or more of Examples 1-17 optionally include a subsequent middle semiconductive device positioned within the interconnect-bridge footprint dimension.

In Example 19, the subject matter of any one or more of Examples 1-18 optionally include a subsequent middle semiconductive device positioned within the interconnect-bridge footprint dimension; and a fourth semiconductive device coupled to the first semiconductive device through the bridge interconnect, and wherein each subsequent and fourth semiconductive devices are across the middle semiconductive device from the first semiconductive device.

In Example 20, the subject matter of any one or more of Examples 1-19 optionally include a subsequent middle semiconductive device positioned within the interconnect-bridge footprint dimension; and a series of memory devices that are coupled to the first semiconductive device through the bridge interconnect.

Example 21 is a process of assembling a semiconductor device package, comprising: assembling a middle semiconductive device below an interconnect bridge, wherein the interconnect bridge includes a footprint dimension, wherein the middle semiconductive device is positioned within the interconnect-bridge footprint dimension; assembling a first semiconductive device and a subsequent semiconductive device to the interconnect bridge to couple the first semiconductive device and the subsequent semiconductive device through the interconnect bridge, and wherein the first semiconductive device and the subsequent semiconductive device are outside the interconnect-bridge footprint dimension; and assembling the interconnect bridge to a structure selected from a semiconductor package substrate and a redistribution layer.

In Example 22, the subject matter of Example 21 optionally includes forming an interlayer dielectric to at least partially encapsulate the first semiconductive device, the middle semiconductive device, the subsequent semiconductive device and the interconnect bridge; and forming a bridge-interconnect filled via to penetrate the interlayer dielectric to contact the interconnect bridge; and forming a filled via that penetrates the interconnect layer dielectric to contact the middle semiconductive device.

In Example 23, the subject matter of any one or more of Examples 21-22 optionally include forming an interlayer dielectric to at least partially encapsulate the first semiconductive device, the middle semiconductive device, the subsequent semiconductive device and the interconnect bridge; and forming a bridge-interconnect filled via to penetrate the interlayer dielectric to contact the interconnect bridge; forming a filled via that penetrates the interconnect layer dielectric to contact the middle semiconductive device; and assembling the interconnect bridge to a computing system.

Example 24 is a computing system, comprising: a first semiconductive device; a middle semiconductive device; a subsequent semiconductive device; an interconnect bridge, wherein the interconnect bridge includes a footprint dimension, wherein the middle semiconductive device is positioned within the interconnect-bridge footprint dimension; a structure selected from a semiconductor package substrate and a redistribution layer, wherein the first semiconductive device, and the subsequent semiconductive device are positioned across the middle semiconductive device, wherein the first semiconductive device and the subsequent semiconductive device are coupled through the interconnect bridge, and wherein the first semiconductive device and the subsequent semiconductive device are mounted on the structure; wherein the interconnect bridge is suspended above the middle semiconductive device and the structure; an interlayer dielectric that at least partially encapsulates the middle semiconductive device; a first bridge-interconnect filled via that penetrates the interlayer dielectric to contact the interconnect bridge; a first trace on the structure that contacts the interconnect bridge and that couples the first semiconductive device to the interconnect bridge; a subsequent bridge-interconnect filled via that penetrates the interlayer dielectric to contact the interconnect bridge; a subsequent trace on the structure that contacts the interconnect bridge and that couples the subsequent semiconductive device to the interconnect bridge; and wherein the interconnect bridge is part of a chipset.

In Example 25, the subject matter of Example 24 optionally includes an encapsulation material that contacts the structure, the first semiconductive device, the interlayer dielectric, the interconnect bridge and the subsequent semiconductive device; and a shell that is coupled to the structure, wherein the shell provides at least one of physical and dielectric protection to the chipset.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

With semiconductive devices, an "active surface" includes active semiconductive devices and may include metallization that connects to the active semiconductive devices. A "backside surface" is the surface opposite the active surface.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor device, comprising:
a first semiconductor die and a second semiconductor die coupled to a substrate;
a middle semiconductor die coupled to the substrate and located laterally between the first semiconductor die and the second semiconductor die;
an interconnect bridge located above the middle semiconductor die, wherein the interconnect bridge is coupled between the first semiconductor die and the second semiconductor die.

2. The semiconductor device of claim 1, wherein the interconnect bridge couples to a bottom surface of the first semiconductor die.

3. The semiconductor device of claim 2, wherein the interconnect bridge couples to a bottom surface of the second semiconductor die.

4. The semiconductor device of claim 1, wherein a bridge die metallization faces the middle semiconductor die.

5. The semiconductor device of claim 1, wherein the interconnect bridge is wider than the middle semiconductor die.

6. The semiconductor device of claim 1, wherein the first semiconductor die includes a graphics processor.

7. The semiconductor device of claim 6, wherein the second semiconductor die includes a core processor.

8. The semiconductor device of claim 1, wherein the interconnect bridge includes a silicon interconnect bridge.

9. The semiconductor device of claim 1, wherein the interconnect bridge includes an organic interconnect bridge.

10. A semiconductor device, comprising:
a first semiconductor die and a second semiconductor die coupled to a substrate;
a middle semiconductor die coupled to the substrate and located laterally between the first semiconductor die and the second semiconductor die, wherein the middle semiconductor die has a thickness less than one or more of the first semiconductor die and the second semiconductor die;
an interconnect bridge stacked with the middle semiconductor die, wherein the interconnect bridge is coupled between the first semiconductor die and the second semiconductor die.

11. The semiconductor device of claim 10, wherein a combined thickness of the middle semiconductor die and the interconnect bridge is less than or equal to a thickness of the first semiconductor die.

12. The semiconductor device of claim 10, wherein a combined thickness of the middle semiconductor die and the interconnect bridge is less than or equal to a thickness of the second semiconductor die.

13. The semiconductor device of claim 10, wherein a top surface of the interconnect bridge is coplanar with the first semiconductor die and the second semiconductor die.

14. The semiconductor device of claim 10, wherein a bridge die metallization faces the middle semiconductor die.

15. The semiconductor device of claim 10, wherein the interconnect bridge is wider than the middle semiconductor die.

16. The semiconductor device of claim 10, wherein the first semiconductor die includes a graphics processor.

17. The semiconductor device of claim 16, wherein the second semiconductor die includes a core processor.

18. The semiconductor device of claim 10, wherein the interconnect bridge includes a silicon interconnect bridge.

19. The semiconductor device of claim 10, wherein the interconnect bridge includes an organic interconnect bridge.

* * * * *